United States Patent
Yen et al.

(10) Patent No.: US 11,387,315 B2
(45) Date of Patent: Jul. 12, 2022

(54) PATTERNED SHIELDING STRUCTURE AND INTEGRATED INDUCTOR

(71) Applicant: Realtek Semiconductor Corporation, Hsinchu (TW)

(72) Inventors: Hsiao-Tsung Yen, Hsinchu (TW); Ka-Un Chan, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 17/081,238

(22) Filed: Oct. 27, 2020

(65) Prior Publication Data
US 2021/0225998 A1 Jul. 22, 2021

Related U.S. Application Data

(60) Provisional application No. 62/963,616, filed on Jan. 21, 2020.

(30) Foreign Application Priority Data

May 21, 2020 (TW) ................. 109116986

(51) Int. Cl.
*H01L 49/02* (2006.01)
*H01L 23/552* (2006.01)

(52) U.S. Cl.
CPC ............ *H01L 28/10* (2013.01); *H01L 23/552* (2013.01)

(58) Field of Classification Search
CPC ............... H01L 28/10; H01L 23/552; H01L 2924/0002; H01L 2924/00; H01L 23/5227
USPC .......... 257/531, E27.046, E21.022; 336/200, 336/84 C, 155
See application file for complete search history.

(56) References Cited

U.S. PATENT DOCUMENTS

| | | | |
|---|---|---|---|
| 9,780,162 B2 | 10/2017 | Yen et al. | |
| 9,883,590 B2 | 1/2018 | Huang et al. | |
| 10,134,684 B2 | 11/2018 | Yen et al. | |
| 2017/0076857 A1* | 3/2017 | Huang | .......... H01F 27/363 |
| 2019/0019749 A1* | 1/2019 | Huang | ............ H01L 23/5227 |

FOREIGN PATENT DOCUMENTS

| | | |
|---|---|---|
| TW | I293765 B | 2/2008 |
| TW | 201711066 A | 3/2017 |
| TW | 108134470 | 9/2019 |

OTHER PUBLICATIONS

U.S. Appl. No. 16/830,555, filed Mar. 26, 2020.

* cited by examiner

*Primary Examiner* — Didarul A Mazumder
(74) *Attorney, Agent, or Firm* — Locke Lord LLP; Tim Tingkang Xia, Esq.

(57) ABSTRACT

A patterned shielding structure is disposed between an inductor structure and a substrate. The patterned shielding structure includes a shielding layer. The shielding layer includes a first main portion and a plurality of branch portions. The first main portion is T-shaped. The branch portions are connected to the first main portion.

19 Claims, 8 Drawing Sheets

PATTERNED SHIELDING STRUCTURE AND INTEGRATED INDUCTOR

RELATED APPLICATIONS

This application claims priority to U.S. Provisional Application Ser. No. 62/963,616 filed Jan. 21, 2020 and Taiwanese Application Serial Number 109116986 filed May 21, 2020, which are herein incorporated by reference.

BACKGROUND

Technical Field

The present disclosure relates to a semiconductor technology. More particularly, the present disclosure relates to a patterned shielding structure and an integrated inductor.

Description of Related Art

With development of the integrated circuit (IC) technology, electrical elements in an integrated circuit become smaller and smaller. However, when electrical elements in an integrated circuit become smaller, many negative impacts will occur. For example, a quality factor value (Q value) of an inductor is affected due to eddy currents generated on a substrate when the inductor operates.

SUMMARY

One embodiment of the present disclosure is related to a patterned shielding structure. The patterned shielding structure is disposed between an inductor structure and a substrate. The patterned shielding structure includes a shielding layer. The shielding layer includes a first main portion and a plurality of branch portions. The first main portion is T-shaped. The branch portions are connected to the first main portion.

One embodiment of the present disclosure is related to an integrated inductor. The integrated inductor includes a substrate, an inductor structure, and a patterned shielding structure. The patterned shielding structure is disposed between the inductor structure and the substrate. The patterned shielding structure includes a shielding layer. The shielding layer includes a first main portion and a plurality of branch portions. The first main portion is T-shaped and is connected to the plurality of branch portions.

As the above embodiments, the patterned shielding structure of the present disclosure has better shielding effects.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
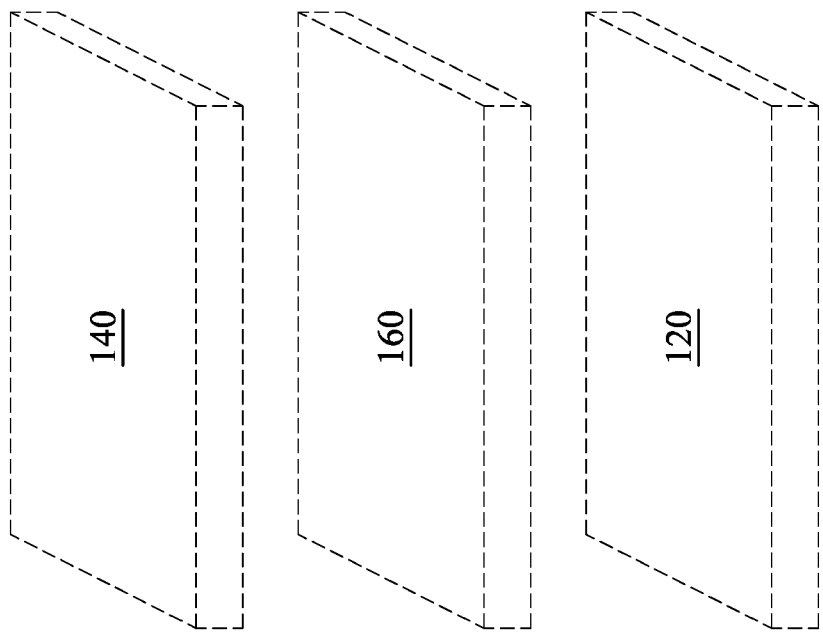
FIG. 1 is a schematic diagram illustrating an integrated inductor according to some embodiments of the present disclosure.

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure. In addition, the drawings are for purposes of illustration only, and are not drawn according to the original sizes. For ease of understanding, the same elements or similar elements in the following descriptions are described with the same reference numerals.

In the present disclosure, unless there is a special limitation, "a" and "the" may refer to a single element or multiple elements. It will be further understood that "include", "include", "having" and other similar terms used in this specification indicates the features, regions, integers, steps, operations, components and/or components, but does not exclude one or more of the other features, regions, integers, steps described or added, Operations, components, assemblies, and/or groups thereof.

Reference is made to FIG. 1. FIG. 1 is a schematic diagram illustrating an integrated inductor 100 according to some embodiments of the present disclosure. As illustrated in FIG. 1, the integrated inductor 100 includes a substrate 120, an inductor structure 140, and a patterned shielding structure 160.

As illustrated in FIG. 1, the substrate 120, the inductor structure 140, and the patterned shielding structure 160 are disposed at a plane formed by a direction X and a direction Y, in which the direction X is perpendicular to the direction Y. In some embodiments, the substrate 120, the inductor structure 140, and the patterned shielding structure 160 are aligned in a direction Z, in which the direction Z is perpendicular to the direction X and the direction Y.

Figure 2:
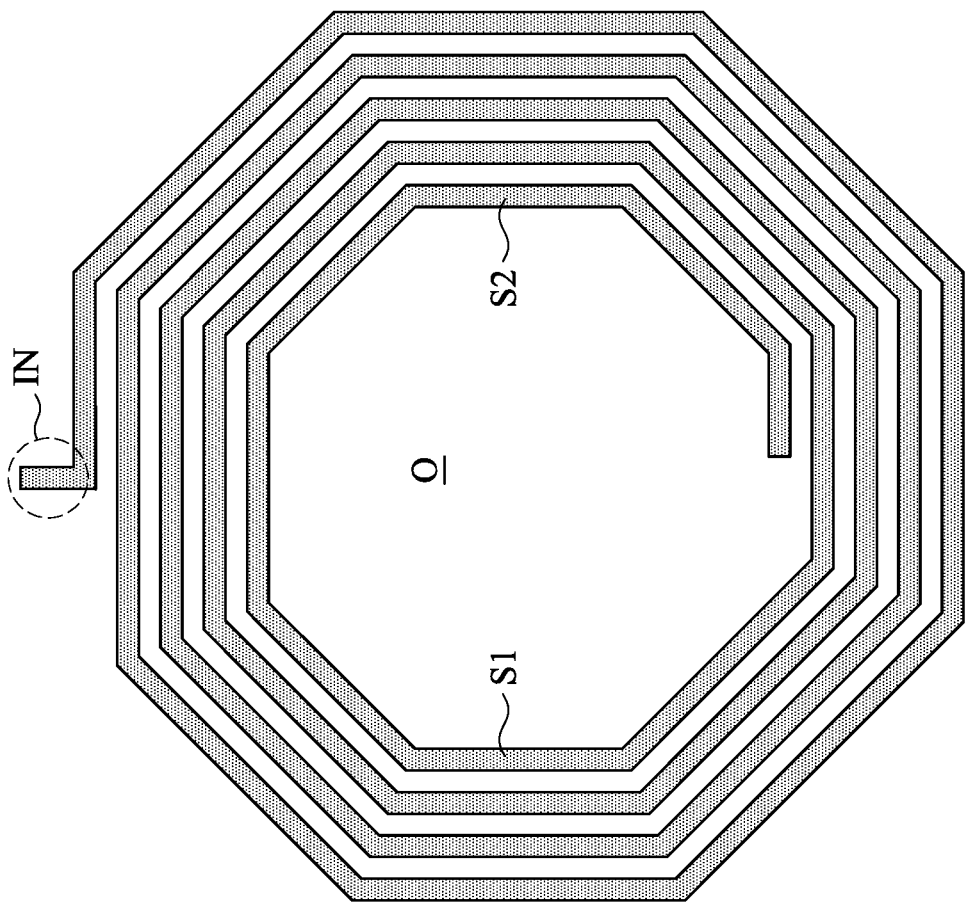
FIG. 2 is a schematic diagram illustrating an inductor structure according to some embodiments of the present disclosure.

References are made to FIG. 1 and FIG. 2. FIG. 2 is a schematic diagram illustrating an inductor structure 140A according to some embodiments of the present disclosure. In some embodiments, the inductor structure 140A in FIG. 2 is configured to implement the inductor structure 140 in FIG. 1, but the present disclosure is not limited thereto. In some embodiments, the inductor structure 140 is applied in a system with differential signals.

As illustrated in FIG. 2, the inductor structure 140 is spiral-shaped. An opening O is formed at the center of the inductor structure 140. A metal segment S1 and a metal segment S2 are disposed at two sides of the opening O respectively. In some related approaches, if there is no patterned shielding structure between the substrate 120 and the inductor structure 140, an eddy current is generated on the substrate 120 due to a magnetic field generated when the inductor structure 140 operates. The eddy current affects the quality factor value (Q value) of the inductor structure 140.

However, in FIG. 1, the patterned shielding structure 160 is disposed between the substrate 120 and the inductor structure 140. The patterned shielding structure 160 can reduce the mutual inductance between the two metal segments (for example, the metal segment S1 and the metal segment S2) at two sides of the inductor structure 140 effectively, to prevent the aforementioned eddy current from being generated on the substrate 120, such that the quality factor value (Q value) of the inductor structure 140 can be maintained effectively and noise can be avoided.

In some embodiments, the patterned shielding structure 160 is formed in a metal layer (M1). In some embodiments, the patterned shielding structure 160 may be connected to the ground, but the present disclosure is not limited thereto.

The configurations or the shape of the inductor structure 140A in the aforementioned embodiments are given for illustrative purposes only. Various configurations or various shapes configured to implement the inductor structure 140A are within the contemplated scopes of the present disclosure.

Figure 3:
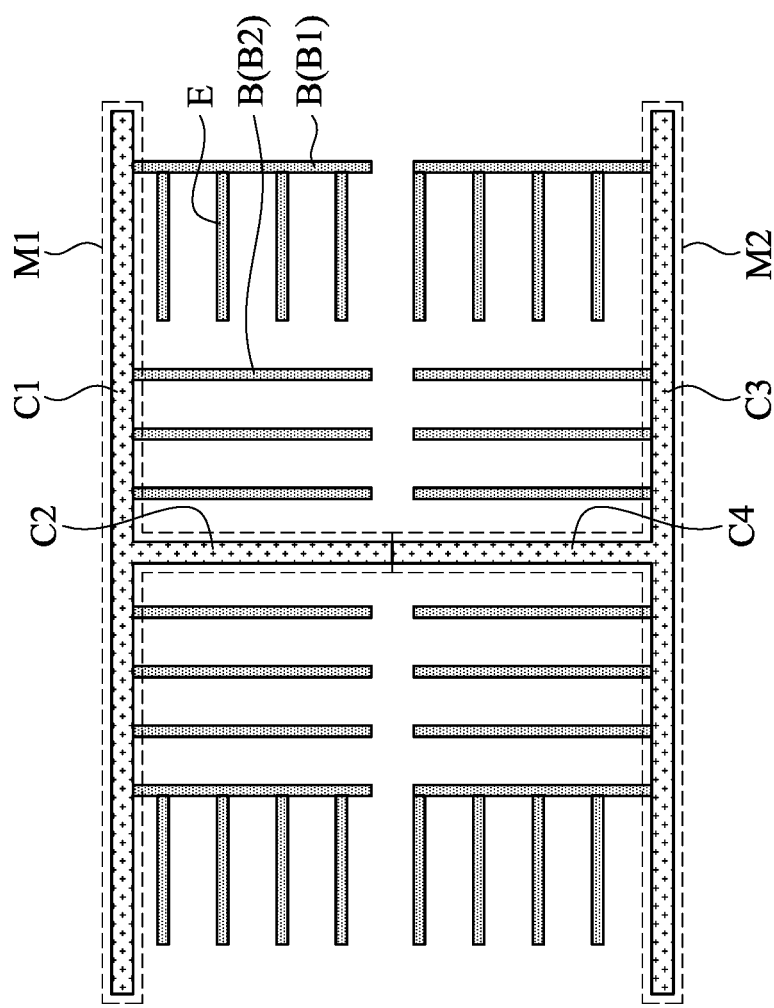
FIG. 3 is a schematic diagram illustrating a patterned shielding structure according to some embodiments of the present disclosure.

References are made to FIG. 3. FIG. 3 is a schematic diagram illustrating a patterned shielding structure 160A according to some embodiments of the present disclosure. In some embodiments, the patterned shielding structure 160A in FIG. 3 is configured to implement the patterned shielding structure 160 in FIG. 1, but the present disclosure is not limited thereto. As illustrated in FIG. 3, the patterned shielding structure 160A (shielding layer) includes a main portion M1, a main portion M2, and a plurality of branch portions B. In some embodiments, the main portion M1 and the main portion M2 have a first line width, the branch portions B have a second line width, and the first line width is greater than the second line width. In other words, compared to the branch portions B, the main portion M1 and the main portion M2 are wider. In some further embodiments, the first line width is twice or more than twice the second line width.

The main portion M1 and the main portion M2 are T-shaped. The main portion M1 is connected to the main portion M2. The branch portions B are connected to the main portion M1 or the main portion M2. In specific, the main portion M1 includes a conductive component C1 and a conductive component C2. The main portion M2 includes a conductive component C3 and a conductive component C4. The conductive component C1 and the conductive component C3 extend in the direction X. The conductive component C2 and the conductive component C4 extend in the direction Y. A length of the conductive component C1 is equal to a length of the conductive component C3. A length of the conductive component C2 is equal to a length of the conductive component C4. The length of the conductive component C1 (or the conductive component C3) is greater than the length of the conductive component C2 (or the conductive component C4). The branch portions B1 are comb-shaped, and the branch portions B2 are elongated. In some embodiments, all of the comb-shaped branch portions B1 are oriented in the same direction (for example, a negative side of the direction X). In some embodiments, compared to the branch portions B1, branch portions B2 are closer to the conductive component C2 (or the conductive component C4).

As illustrated in FIG. 3, a single branch portion B1 has an even number (for example: 4) of comb teeth portions E, and lengths of the comb teeth portions E are equal to each other. In some other embodiments, a single branch portion B1 has an odd number of comb teeth portions E. In some other embodiments, the numbers of the comb teeth portions E of the branch portions B1 are completely different or partially different.

As illustrated in FIG. 3, numbers of the branch portions B2 in each of regions are odd. For example, the number of the branch portions B2 connected to the conductive component C1 and disposed at the right side of the conductive component C2 is three (odd). The number of the branch portions B2 connected to the conductive component C1 and disposed at the left side of the conductive component C2 is three (odd). The number of the branch portions B2 connected to the conductive component C3 and disposed at the right side of the conductive component C4 is three (odd). The branch portions B2 connected to the conductive component C3 and disposed at the left side of the conductive component C4 is three (odd). In some other embodiments, the numbers of the branch portions B2 in each of regions are even.

In addition, as illustrated in FIG. 2, the inductor structure 140A includes an input terminal IN. The input terminal IN is configured to receive input signals. In FIG. 3, a vertical projection, on the plane formed by the directions X and Y, of the patterned shielding structure 160A at least partially overlaps with a vertical projection, on the plane, of the input terminal IN. For example, the connection position of the conductive component C1 and the conductive component C2 is above the input terminal IN in FIG. 2. With this configuration, better shielding effects can be achieved.

Figure 4:
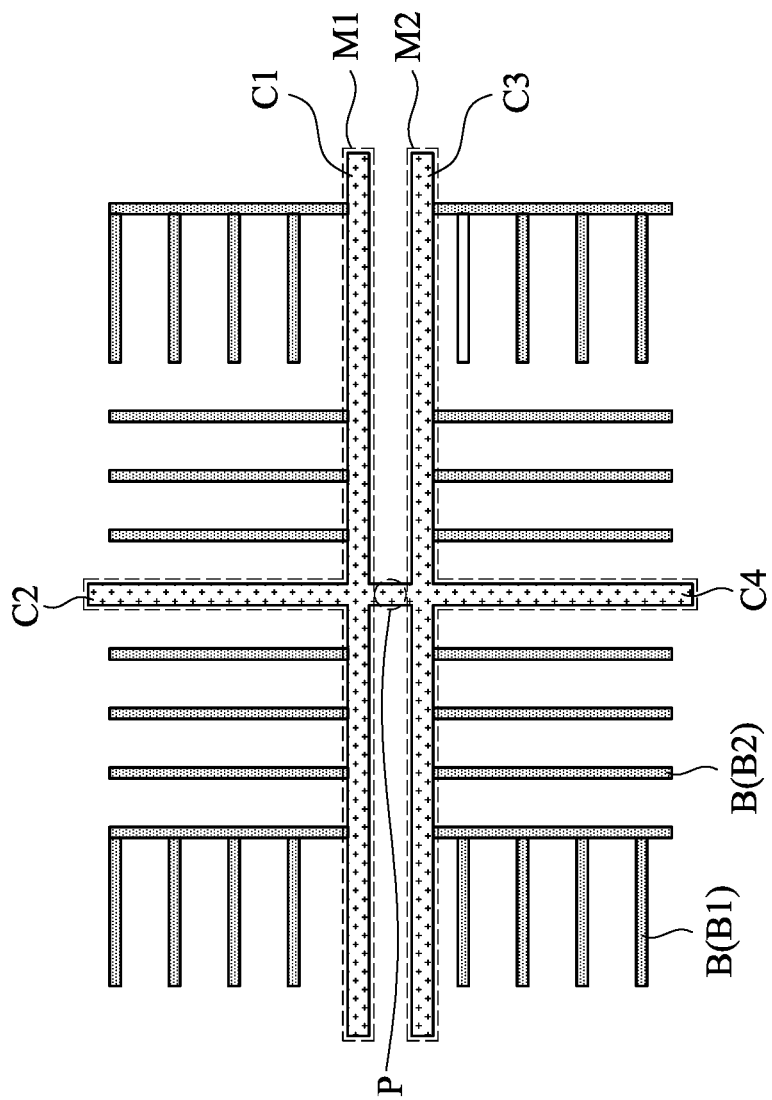
FIG. 4 is a schematic diagram illustrating a patterned shielding structure according to some embodiments of the present disclosure.

Reference is made to FIG. 4. FIG. 4 is a schematic diagram illustrating a patterned shielding structure 160B according to some embodiments of the present disclosure. In some embodiments, the patterned shielding structure 160B in FIG. 4 is configured to implement the patterned shielding structure 160 in FIG. 1, but the present disclosure is not limited thereto. A main difference between the patterned shielding structure 160B in FIG. 4 and the patterned shielding structure 160A in FIG. 3 is that, in the patterned shielding structure 160B in FIG. 4, a conductive component C1 is adjacent to a conductive component C3, and a conductive component C2 is connected to a conductive component C4 by a connection portion P. Alternatively stated, there is no branch portion in the space between the conductive component C1 and the conductive component C3, and only the connection portion P is disposed in the space between the conductive component C1 and the conductive component C3.

Figure 5:
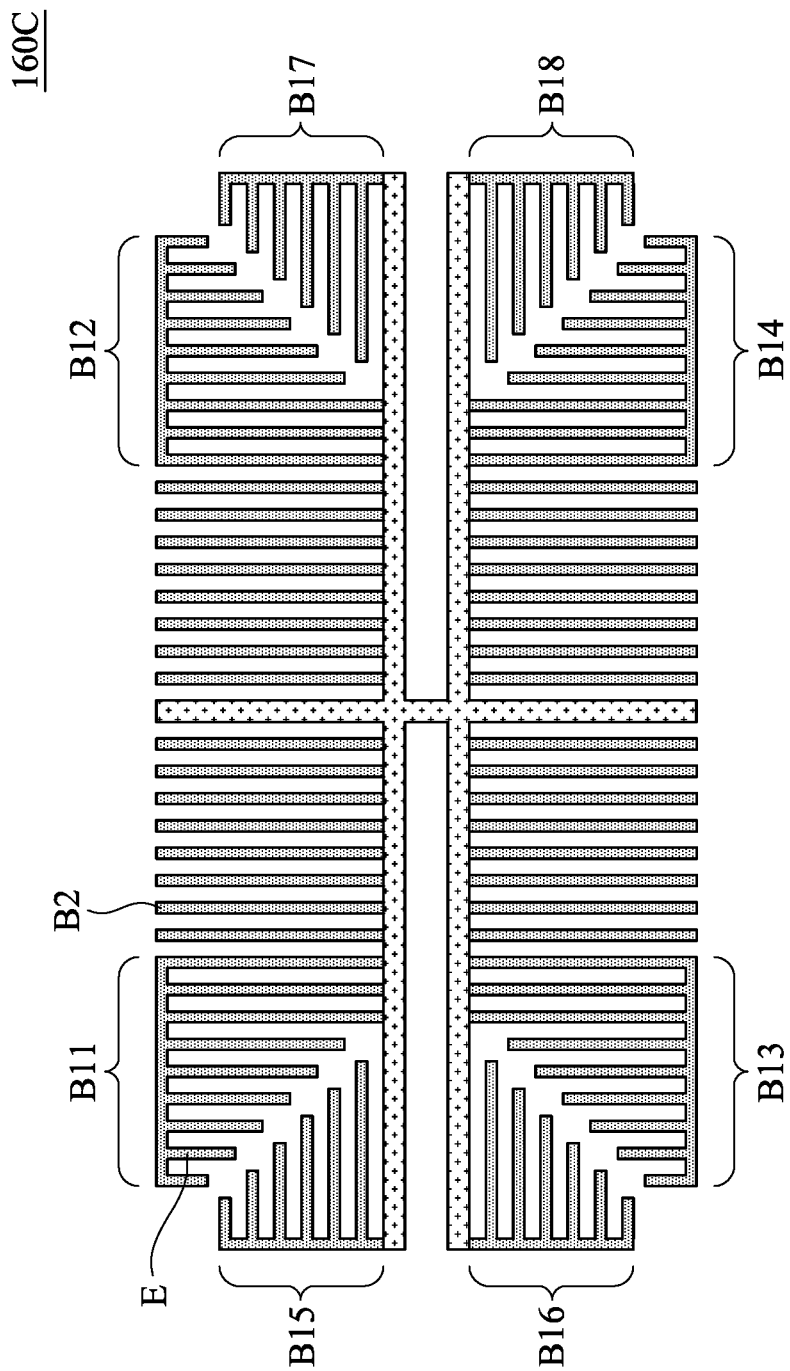
FIG. 5 is a schematic diagram illustrating a patterned shielding structure according to some embodiments of the present disclosure.

Reference is made to FIG. 5. FIG. 5 is a schematic diagram illustrating a patterned shielding structure 160C according to some embodiments of the present disclosure. In some embodiments, the patterned shielding structure 160C in FIG. 5 is configured to implement the patterned shielding structure 160 in FIG. 1, but the present disclosure is not limited thereto. A main difference between the patterned shielding structure 160C in FIG. 5 and the patterned shielding structure 160B in FIG. 4 is that, in the patterned shielding structure 160C in FIG. 5, all of comb-shaped branches B11-B18 are not oriented in the same direction. As illustrated in FIG. 5, the branch B11 and the branch B12 are oriented in a first direction (a negative side of the direction X), the branch B13 and the branch B14 are oriented in a second direction (a positive side of the direction Y), the branch B15 and the branch B16 are oriented in a third direction (a positive side of the direction X), and the branch B17 and the branch B18 are oriented in a fourth direction (the negative side of the direction X).

In addition, as illustrated in FIG. 5, lengths of all comb teeth E in a single branch portion (for example, the branch portion B11) are partially different. In some other embodiments, the lengths of the all comb teeth E in a single branch portion are completely different.

The configurations of the branch portions B11-B18 and B2 are only for illustration, and various configurations of the branch portions B11-B18 and B2 are within the contemplated scopes of the present disclosure.

Figure 6:
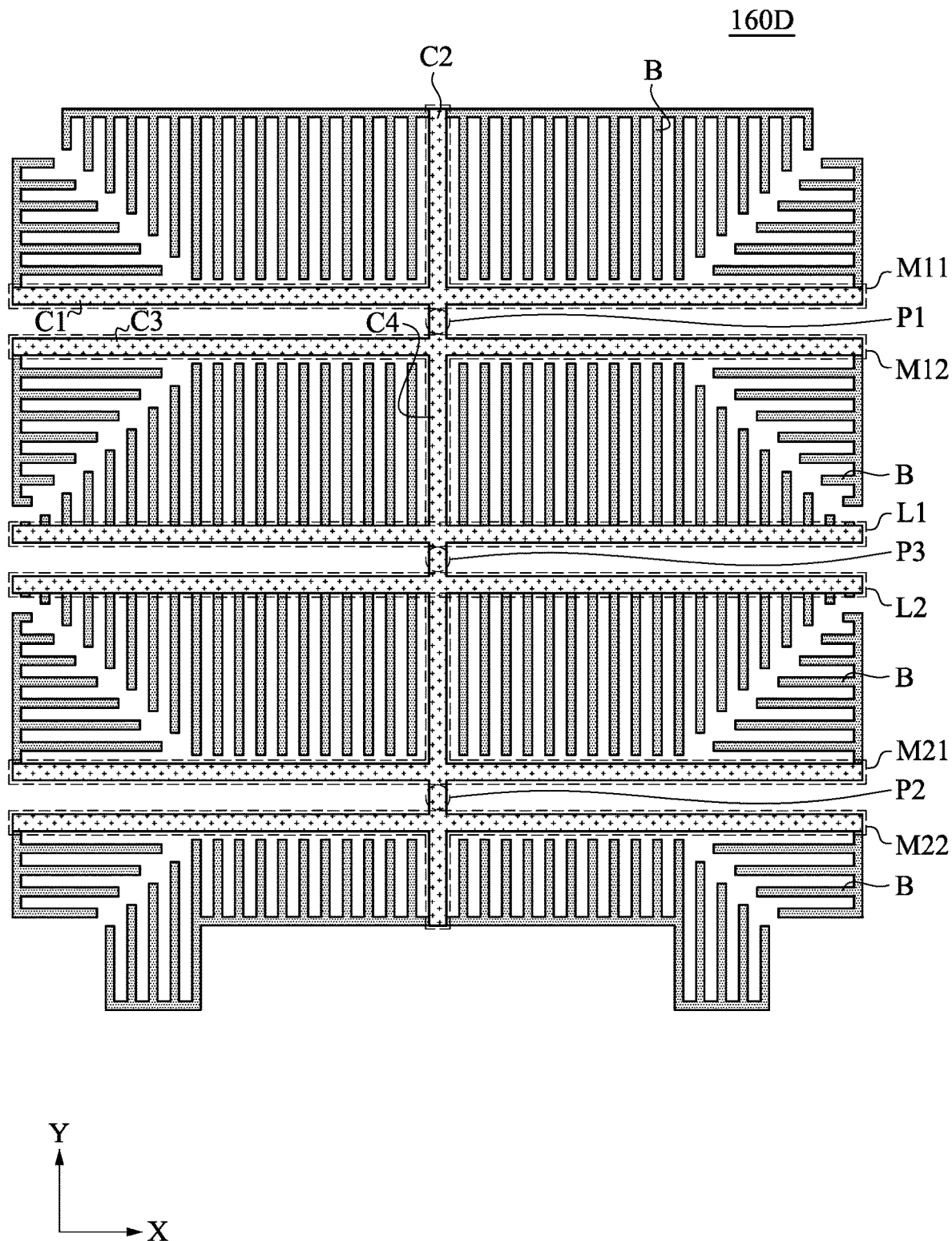
FIG. 6 is a schematic diagram illustrating a patterned shielding structure according to some embodiments of the present disclosure.

Reference is made to FIG. 6. FIG. 6 is a schematic diagram illustrating a patterned shielding structure 160D according to some embodiments of the present disclosure. In some embodiments, the patterned shielding structure 160D in FIG. 6 is configured to implement the patterned shielding structure 160 in FIG. 1, but the present disclosure is not limited thereto. As illustrated in FIG. 6, in the patterned shielding structure 160D, a main portion M11, a main portion M12, a main portion M21, and a main portion M22 are T-shaped. A main portion L1 and a main portion L2 are elongated. The main portion M11 and the main portion M12 are connected by a connection portion P1. The main portion M21 and the main portion M22 are connected by a connection portion P2. The main portion L1 is connected to the main portion M12. The main portion L2 is connected to the main portion M21. The main portion L1 and the main portion L2 are connected by a connection portion P3. Thus, the main portion M11, the main portion M12, the main portion M21, the main portion M22, the main portion L1, the main portion L2, the connection portion P1, the connection portion P2, and the connection portion P3 together form a fishbone structure.

In some embodiments, the main portion M11, the main portion M12, the main portion M21, the main portion M22, the main portion L1, and the main portion L2 have a first line width, other branch portions have a second line width, and the first line width is greater than the second line width. When a ratio of the first line width and the second line width is 1.5 or more than 1.5, a better quality factor value (Q value) is achieved. In other words, compared to the branch portions, the main portion M11, the main portion M12, the main portion M21, the main portion M22, the main portion L1, and the main portion L2 are wider. In some further embodiments, the first line width is twice or more than twice the second line width.

Figure 7:
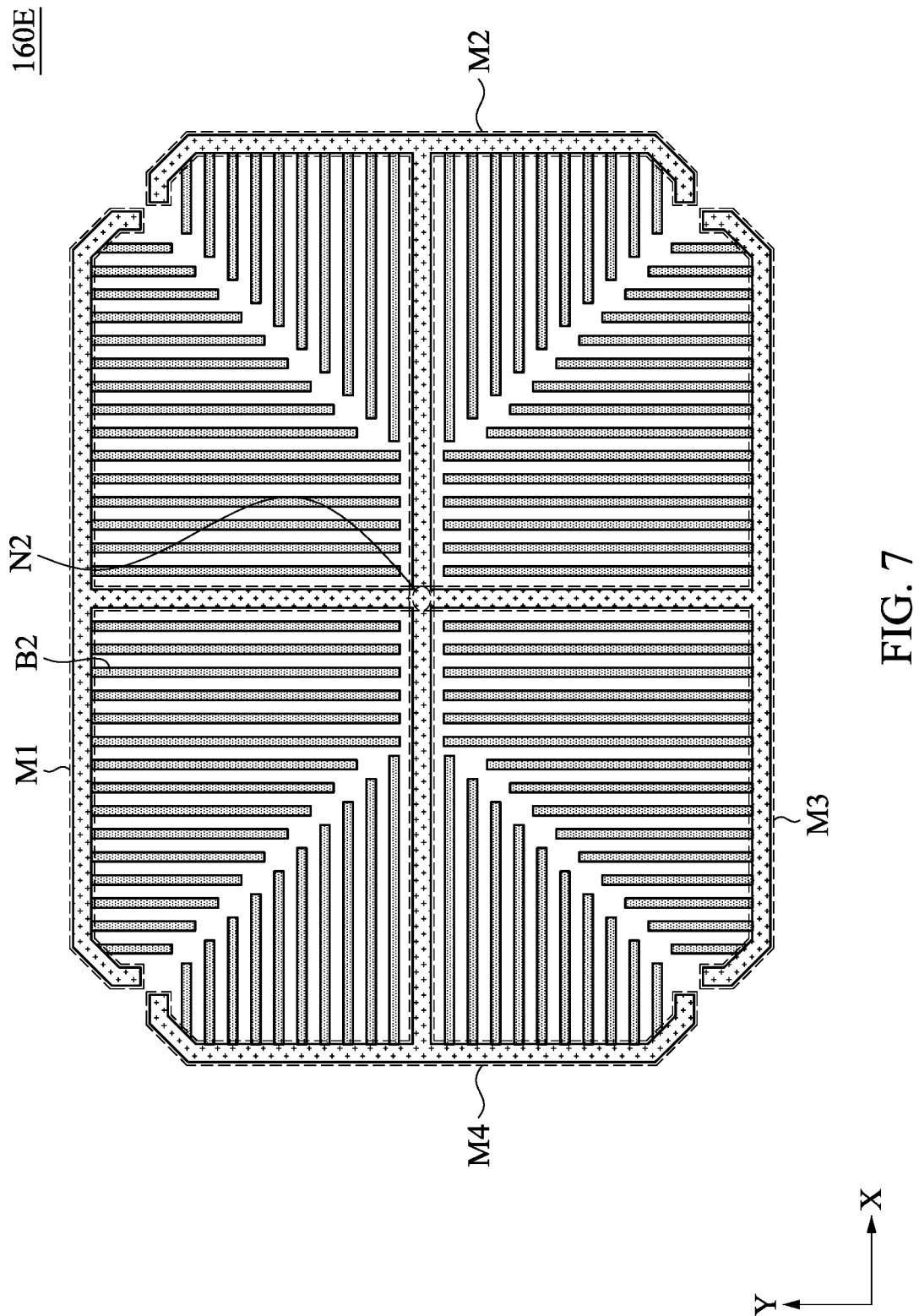
FIG. 7 is a schematic diagram illustrating a patterned shielding structure according to some embodiments of the present disclosure.

Reference is made to FIG. 7. FIG. 7 is a schematic diagram illustrating a patterned shielding structure 160E according to some embodiments of the present disclosure. In some embodiments, the patterned shielding structure 160E in FIG. 7 is configured to implement the patterned shielding structure 160 in FIG. 1, but the present disclosure is not limited thereto. As illustrated in FIG. 7, the patterned shielding structure 160E includes a main portion M1, a main portion M2, a main portion M3, and a main portion M4. The main portion M1, the main portion M2, the main portion M3, and the main portion M4 are T-shaped and are arranged by 90 degrees sequentially. The main portion M1, the main portion M2, the main portion M3, and the main portion M4 are connected at a connection node N2. The patterned shielding structure 160E further includes elongated branch portions B2. The branch portions B2 are connected the main portion M1, the main portion M2, the main portion M3, and the main portion M4, and the branch portions B2 are disposed at spaces between two of the main portions M1-M4. For example, some of the branch portions B2 are disposed at the space between the main portion M1 and the main portion M3. Some of the branch portions B2 are disposed at the space between the main portion M1 and the main portion M4. Some of the branch portions B2 are disposed at the space between the main portion M2 and the main portion M3. Some of the branch portions B2 are disposed at the space between the main portion M2 and the main portion M4.

In some embodiments, the main portion M1, the main portion M2, the main portion M3, and the main portion M4 have a first line width, the branch portions B1 and the branch portions B2 have a second line width, and the first line width is greater than the second line width. In other words, compared to the branch portions B1 and the branch portions B2, the main portion M1, the main portion M2, the main portion M3, and the main portion M4 are wider. In some further embodiments, the first line width is twice or more than twice the second line width.

Figure 8:
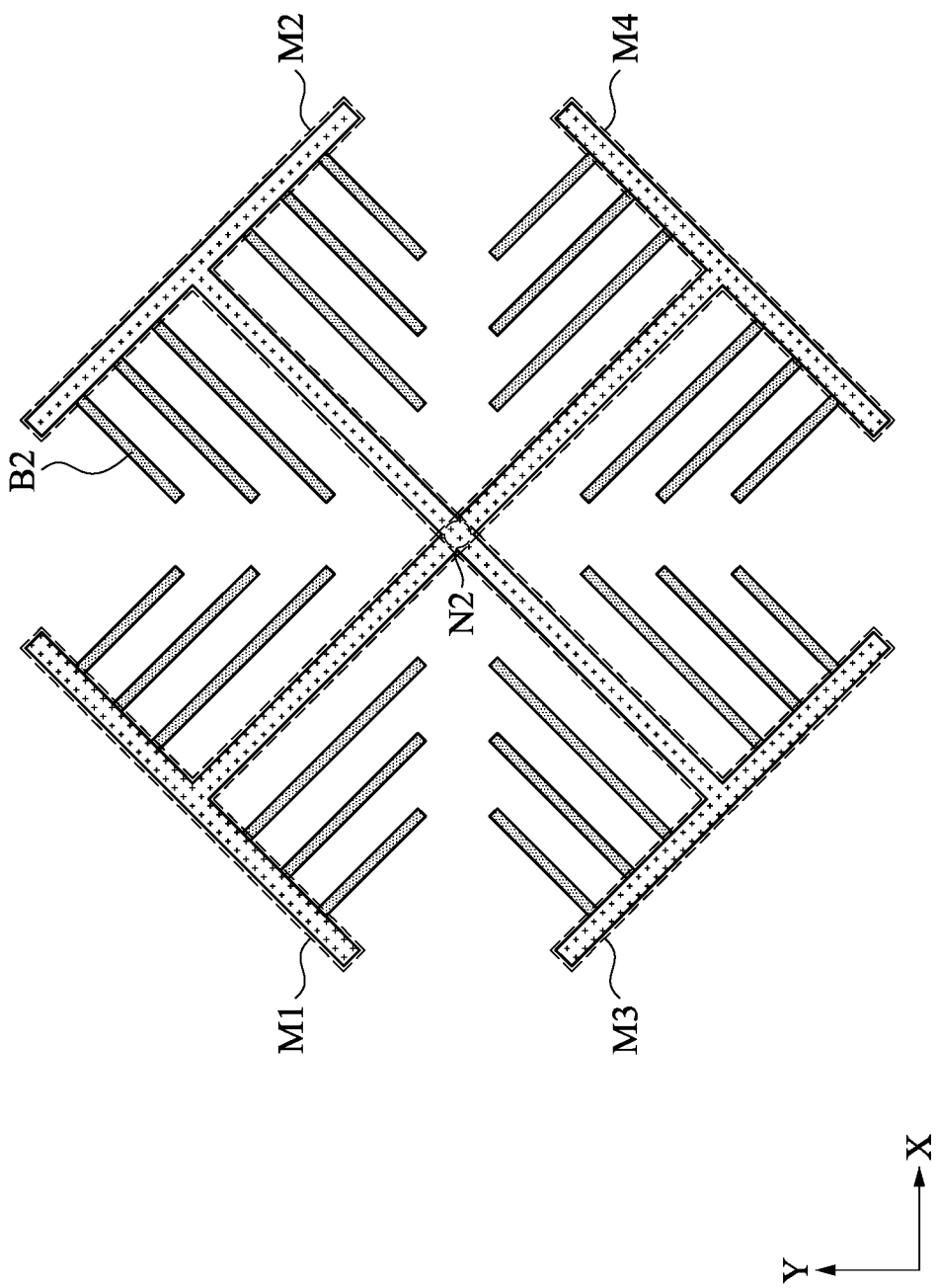
FIG. 8 is a schematic diagram illustrating a patterned shielding structure according to some embodiments of the present disclosure.

Reference is made to FIG. 8. FIG. 8 is a schematic diagram illustrating a patterned shielding structure 160F according to some embodiments of the present disclosure. In some embodiments, the patterned shielding structure 160F in FIG. 8 is configured to implement the patterned shielding structure 160 in FIG. 1, but the present disclosure is not limited thereto. The patterned shielding structure 160F in FIG. 8 includes a main portion M1, a main portion M2, a main portion M3, a main portion M4, and a branch portion B2. The main portion M1, the main portion M2, the main portion M3, and the main portions M4 are connected to a connection node N2. Branch portions B2 are elongated and lengths of the all branch portions B2 are not equal. In addition, compared to the main portions M1-M4 of the patterned shielding structure 160E in FIG. 7, the main portions M1-M4 of the patterned shielding structure 160F in FIG. 8 are rotated by a degree (for example, 45 degree), but the present disclosure is not limited to this degree.

In some embodiments, the patterned shielding structures 160A-160F are symmetry up and down. Accordingly, better shielding effects can be achieved. However, in some other embodiments, the patterned shielding structures 160A-160F are not symmetry up and down.

As the above embodiments, the patterned shielding structure of the present disclosure has better shielding effects.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A patterned shielding structure disposed between an inductor structure and a substrate, wherein the patterned shielding structure comprises:
 a shielding layer comprising:
  a first main portion being T-shaped; and a plurality of branch portions connected to the first main portion,
wherein the first main portion has a first line width, the one of the plurality of branch portions has a second line width, and the first line width is different from the second line width.

2. The patterned shielding structure of claim 1, wherein the first line width is greater than the second line width.

3. The patterned shielding structure of claim 2, wherein the first line width is twice or more than twice the second line width.

4. The patterned shielding structure of claim 1, further comprising:
a second main portion being T-shaped and connected to the first main portion.

5. The patterned shielding structure of claim 4, wherein the first main portion comprises a first conductive component and a second conductive component, and the second main portion comprises a third conductive component and a fourth conductive component, wherein the first conductive component and the third conductive component extend in a first direction, the second conductive component and the fourth conductive component extend in a second direction, and the second direction is perpendicular to the first direction.

6. The patterned shielding structure of claim 5, wherein the first conductive component and the third conductive component are adjacent, and the second conductive component and the fourth conductive component are connected via a connection portion.

7. The patterned shielding structure of claim 5, wherein the inductor structure comprises an input terminal, wherein a first vertical projection, on a plane, of the shielding layer at least partially overlaps with a second vertical projection, on the plane, of the input terminal, wherein the plane is formed by the first direction and the second direction.

8. The patterned shielding structure of claim 4, wherein the patterned shielding structure comprises a plurality of the first main portions and a plurality of the second main portions, wherein the plurality of the first main portions, the plurality of the second main portions, a plurality of third main portions, and a plurality of connection portions together form a fishbone structure, wherein the plurality of third main portions are elongated.

9. The patterned shielding structure of claim 4, further comprising:
a third main portion being T-shaped; and
a fourth main portion being T-shaped, wherein the first main portion, the second main portion, the third main portion, and the fourth main portion are connected.

10. The patterned shielding structure of claim 9, wherein the second main portion, the third main portion, and the fourth main portion have a first line width, one of the plurality of branch portions has a second line width, and the first line width is greater than the second line width.

11. The patterned shielding structure of claim 1, wherein at least one of the plurality of branch portions is comb-shaped.

12. The patterned shielding structure of claim 1, wherein at least one of the plurality of branch portions is comb-shaped, and at least the other of the plurality of branch portions is elongated.

13. An integrated inductor, comprising:
a substrate;
an inductor structure; and
a patterned shielding structure disposed between the inductor structure and the substrate, wherein the patterned shielding structure comprises a shielding layer, wherein the shielding layer comprises a first main portion and a plurality of branch portions, wherein the first main portion is T-shaped and is connected to the plurality of branch portions,
wherein the first main portion has a first line width, the one of the plurality of branch portions has a second line width, and the first line width is different from the second line width.

14. The integrated inductor of claim 13, wherein the first line width is greater than the second line width.

15. The integrated inductor of claim 14, wherein the first line width is twice or more than twice the second line width.

16. The integrated inductor of claim 13, wherein the patterned shielding structure further comprises:
a second main portion being T-shaped and is connected to the first main portion.

17. The integrated inductor of claim 16, wherein the patterned shielding structure comprises a plurality of the first main portions and a plurality of the second main portions, wherein the plurality of the first main portions, the plurality of the second main portions, a plurality of third main portions, and a plurality of connection portions together form a fishbone structure, wherein the plurality of third main portions are elongated.

18. The integrated inductor of claim 16, wherein the patterned shielding structure further comprises:
a third main portion being T-shaped; and
a fourth main portion being T-shaped, wherein the first main portion, the second main portion, the third main portion, and the fourth main portion are connected.

19. The integrated inductor of claim 18, wherein the second main portion, the third main portion, and the fourth main portion have a first line width, one of the plurality of branch portions has a second line width, and the first line width is greater than the second line width.

* * * * *